United States Patent
Tamura et al.

(10) Patent No.: US 10,202,528 B2
(45) Date of Patent: Feb. 12, 2019

(54) POLYMER AND COMPOSITION INCLUDING SAME, AND ADHESIVE COMPOSITION

(71) Applicant: NISSAN CHEMICAL INDUSTRIES, LTD., Tokyo (JP)

(72) Inventors: Mamoru Tamura, Toyama (JP); Takuya Ohashi, Toyama (JP); Takahiro Kishioka, Toyama (JP); Tomoyuki Enomoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/097,399

(22) Filed: Apr. 13, 2016

(65) Prior Publication Data
US 2016/0222262 A1 Aug. 4, 2016

Related U.S. Application Data

(62) Division of application No. 14/343,923, filed as application No. PCT/JP2012/072747 on Sep. 6, 2012, now abandoned.

(30) Foreign Application Priority Data

Sep. 8, 2011 (JP) .................................. 2011-196318
Sep. 8, 2011 (JP) .................................. 2011-196319

(51) Int. Cl.
| | | |
|---|---|---|
| C09J 179/04 | (2006.01) | |
| C09D 11/10 | (2014.01) | |
| C08G 73/06 | (2006.01) | |
| H01L 23/29 | (2006.01) | |
| H01L 21/02 | (2006.01) | |
| C08G 59/26 | (2006.01) | |
| C08G 59/32 | (2006.01) | |
| C09J 163/00 | (2006.01) | |
| C08K 5/04 | (2006.01) | |
| C08K 5/07 | (2006.01) | |
| C09J 11/06 | (2006.01) | |
| C09D 11/102 | (2014.01) | |
| G03F 7/11 | (2006.01) | |
| G03F 7/09 | (2006.01) | |

(52) U.S. Cl.
CPC ............ *C09J 179/04* (2013.01); *C08G 59/26* (2013.01); *C08G 59/3236* (2013.01); *C08G 73/06* (2013.01); *C08G 73/0633* (2013.01); *C08G 73/0638* (2013.01); *C08G 73/0677* (2013.01); *C08K 5/04* (2013.01); *C08K 5/07* (2013.01); *C09D 11/10* (2013.01); *C09D 11/102* (2013.01); *C09J 11/06* (2013.01); *C09J 163/00* (2013.01); *H01L 21/02118* (2013.01); *H01L 21/02282* (2013.01); *H01L 23/293* (2013.01); *G03F 7/09* (2013.01); *G03F 7/094* (2013.01); *G03F 7/11* (2013.01); *H01L 2924/0002* (2013.01)

(58) Field of Classification Search
CPC ...... H01L 2924/00; C08L 63/00; C09J 179/04
See application file for complete search history.

(56) References Cited

U.S. PATENT DOCUMENTS

| | | | | |
|---|---|---|---|---|
| 8,722,840 | B2 * | 5/2014 | Sakamoto | G03F 7/11 430/271.1 |
| 9,023,588 | B2 | 5/2015 | Nakajima et al. | |
| 2006/0216652 | A1 * | 9/2006 | Kishioka | C08G 18/791 430/311 |
| 2006/0290429 | A1 * | 12/2006 | Kishioka | G03F 7/038 430/270.1 |
| 2008/0003524 | A1 | 1/2008 | Kishioka et al. | |
| 2008/0038678 | A1 * | 2/2008 | Kishioka | C08G 61/122 430/327 |
| 2008/0038679 | A1 | 2/2008 | Sato | |
| 2008/0206680 | A1 | 8/2008 | Kishioka et al. | |

(Continued)

FOREIGN PATENT DOCUMENTS

| | | | |
|---|---|---|---|
| JP | 2008-143954 | * | 6/2008 |
| JP | 2008-143954 A | | 6/2008 |

(Continued)

OTHER PUBLICATIONS

English translation of JP 2008-143954. Obtained from AIPN/JPO website.*

(Continued)

*Primary Examiner* — Michael A Salvitti
(74) *Attorney, Agent, or Firm* — Oliff PLC

(57) ABSTRACT

There is provided a novel polymer, a composition containing the polymer, and a novel adhesive composition containing the polymer from which a cured film having desired properties is obtained. A polymer comprising a structural unit of Formula (1):

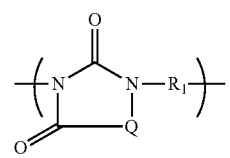

(1)

wherein Q is a bivalent group, $R_1$ is a $C_{1-10}$ alkylene group, a $C_{2-10}$ alkenylene group or $C_{2-10}$ alkynylene group, a $C_{6-14}$ arylene group, a $C_{4-10}$ cyclic alkylene group, etc., or a polymer comprising a structural unit of Formula (6):

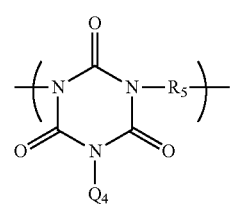

(6)

wherein $Q_4$ is an allyl group, a vinyl group, an epoxy group, or a glycidyl group, and $R_5$ is a bivalent organic group having a main chain containing only carbon atom or at least one of oxygen atom, nitrogen atom and sulfur atom in addition to carbon atom, a composition comprising the polymer, and an adhesive composition comprising the polymer and a solvent.

6 Claims, No Drawings

(56) References Cited

U.S. PATENT DOCUMENTS

| | | | |
|---|---|---|---|
| 2010/0133518 A1* | 6/2010 | Maeda | C08G 59/182 |
| | | | 257/40 |
| 2010/0266951 A1* | 10/2010 | Hiroi | C08G 59/226 |
| | | | 430/270.1 |
| 2010/0272907 A1 | 10/2010 | Paquet, Jr. | |
| 2012/0128891 A1* | 5/2012 | Takei | B82Y 10/00 |
| | | | 427/510 |
| 2012/0315765 A1* | 12/2012 | Nakajima | C07F 7/1836 |
| | | | 438/694 |
| 2013/0230809 A1* | 9/2013 | Sakamoto | G03F 7/11 |
| | | | 430/324 |
| 2014/0228488 A1* | 8/2014 | Tamura | C09D 11/10 |
| | | | 524/111 |
| 2016/0222262 A1* | 8/2016 | Tamura | C09D 11/10 |

FOREIGN PATENT DOCUMENTS

| | | |
|---|---|---|
| JP | 2009-093162 A | 4/2009 |
| WO | 2004/034148 A1 | 4/2004 |
| WO | 2005/098542 A1 | 10/2005 |
| WO | 2006/049045 A1 | 5/2006 |
| WO | 2008/146847 A1 | 12/2008 |

OTHER PUBLICATIONS

Oct. 31, 2016 Office Action issued in U.S. Appl. No. 14/343,923.
Apr. 21, 2016 Office Action issued in U.S. Appl. No. 14/343,923.
Dec. 15, 2014 extended European Search Report issued in European Application No. 12830006.8.
Sep. 27, 2017 extended European Search Report issued in Application No. 17172415.6.

* cited by examiner

POLYMER AND COMPOSITION INCLUDING SAME, AND ADHESIVE COMPOSITION

This is a Divisional application of application Ser. No. 14/343,923 filed Mar. 10, 2014, which is a National Stage application of PCT/JP2012/072747 filed Sep. 6, 2012. The disclosures of the prior applications are hereby incorporated by reference herein in their entireties.

TECHNICAL FIELD

The present invention relates to a novel polymer. The present invention also relates to a composition containing the polymer used for adhesives, formation of insulating films, formation of resist underlayer films, and other applications.

The present invention further relates to an adhesive composition bonding between stacked materials in the step for manufacturing optical devices such as LEDs and CMOS image sensors, and semiconductor devices such as IC chips.

BACKGROUND ART

In recent years, highly integrated semiconductor devices have been sought after for use in high-performance and compact electron equipment such as cell-phones and IC cards. To obtain highly integrated semiconductor devices, fine semiconductor elements, and stack structures in which semiconductor elements are vertically stacked have been developed. For making such stack structures, adhesives are used for bonding between semiconductor elements. However, well-known adhesives such as an acrylic resin, epoxy resin, and silicone resin cannot be applied in the step for electrode assembly of metal bumps, an ion diffusion step, or other steps that require a high temperature of 250° C. or above because those adhesives are heat-resistant at temperatures only around 250° C.

Patent Document 1 discloses an isocyanurate ring-containing polymer that is used in an adhesive for optical semiconductors, and a composition containing the isocyanurate ring-containing polymer. This document discloses that the isocyanurate ring-containing polymer can be obtained by allowing an N-monosubstituted isocyanuric acid to react with a dihalogenated compound under the presence of an alkali metal compound, or by subjecting an N,N',N''-trisubstituted isocyanuric acid and a silane compound to a hydrosilylation reaction. This document also discloses that the composition can be used as an adhesive for optical semiconductors, and can be heated in an oven at 50° C. to 250° C. for 30 minutes to 4 hours for bonding.

The market of flat panel displays (FPDs) such as liquid crystal displays (LCDs) and organic EL (OLED) displays are rapidly expanding. Although glass substrates are used as base materials of display panels in liquid crystal displays, flexible displays in which plastic substrates are used have been developed for obtaining thinner, light weight, and flexible displays, and reducing processing costs by employing Roll-to-Roll processes. However, PET resins, PEN resins, and PC resins known as resin materials used in well-known plastic substrates are heat-resistant at only around 250° C. The resin materials cannot be thus used in a process requiring a high temperature of 250° C. or above that is conventionally required in the step for forming thin film transistors (TFTs).

The process for forming thin film transistors includes a step for forming insulating films such as gate insulating films. Patent Document 2 discloses a gate insulating film forming agent for thin film transistors, with which gate insulating films can be formed at a temperature of 180° C. or below.

PRIOR ART DOCUMENTS

Patent Documents

Patent Document 1: Japanese Patent Application Publication No. 2008-143954
Patent Document 2: WO2008/146847

SUMMARY OF THE INVENTION

Problem to be Solved by the Invention

The light transmittance of a cured material produced from the composition disclosed in Patent Document 1 was measured at 470 nm, and was evaluated as 90% or greater. The heat resistance of the cured material was also evaluated. Although this document discloses that the transmittance at 470 nm was measured after the cured material was left in an oven at 150° C. for 120 hour, the heat resistance at a temperature of 250° C. or above is unclear.

Hydroxy groups are not excluded from the isocyanurate ring-containing polymer of Patent Document 1, and an oligomer compound or a polymer compound contained in the gate insulating film forming agent disclosed in Patent Document 2 has a hydroxy group introduced in a repeating unit of the compound. However, in a case where the polymer has a hydroxy group, the polymer is hygroscopic, and in applications in which insulation performance is essential, desired insulation performance may not be obtained. Furthermore, the isocyanurate ring-containing polymer of Patent Document 1 contains silicon, and thus when the polymer is used to form a film on a substrate such as silicon wafer, a fluorine gas needs to be mixed into an etching gas in the processing through reworking and a photolithography process. This may damage the substrate.

Means for Solving the Problem

A first aspect of the present invention provides a polymer having a weight-average molecular weight of 1,000 to 100,000, comprising a structural unit of Formula (1):

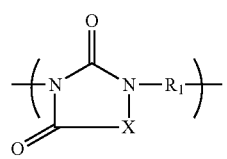
(1)

{where Q is a bivalent group of Formula (2) or Formula (3):

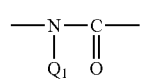
(2)

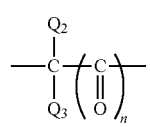
(3)

(where $Q_1$ is a $C_{1-6}$ alkyl group, an allyl group, a vinyl group, an epoxy group, or a glycidyl group, each of $Q_2$ and $Q_3$ is independently a hydrogen atom, a $C_{1-6}$ alkyl group, an allyl group, a vinyl group, an epoxy group, or a glycidyl group, and n is 0 or 1);

when Q is a bivalent group of Formula (2) or Formula (3), and n is 1, a carbonyl group composing a portion of each of Formula (2) and Formula (3) is bonded to a nitrogen atom of Formula (1);

$R_1$ is a $C_{1-10}$ alkylene group, a $C_{2-10}$ alkenylene group or $C_{2-10}$ alkynylene group, a $C_{6-14}$ arylene group, a $C_{4-10}$ cyclic alkylene group, or a group of Formula (4) or Formula (5):

  (4)

  (5)

(where each of $A_1$, $A_2$, and $A_3$ is independently a $C_{6-14}$ arylene group or a $C_{4-10}$ cyclic alkylene group, $R_2$ is a sulfonyl group, a carbonyl group, or a $C_{1-5}$ alkylene group, at least one hydrogen atom of the alkylene group is optionally substituted with a halogen atom, and each of $R_3$ and $R_4$ is independently a $C_{1-5}$ alkylene group)}.

A second aspect of the present invention provides a polymer having a weight-average molecular weight of 1,000 to 100,000, comprising a structural unit of Formula (6):

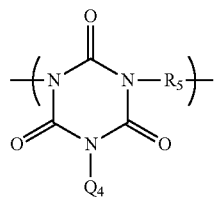  (6)

(where $Q_4$ is an allyl group, a vinyl group, an epoxy group, or a glycidyl group, and $R_5$ is a bivalent organic group having a main chain consisting of a carbon atom or a main chain having a carbon atom and at least one of an oxygen atom, a nitrogen atom, and a sulfur atom).

A third aspect of the present invention provides a composition comprising the polymer according to the present invention.

A fourth aspect of the present invention provides an adhesive composition comprising: a polymer having a structural unit of Formula (6) according to the present invention; and an organic solvent.

Effects of the Invention

It is possible to obtain a cured film that has high heat resistance, high transmittance to visible light, good reworkability, adhesiveness, and desired insulation performance, by e use of a composition comprising a polymer having a structural unit of Formula (1) according to the present invention.

A cured film formed from an adhesive composition of the present invention has a transmittance of 95% or above (at a wavelength of 500 nm), heat resistance at a temperature of 250° C. or above, adhesiveness, and solvent resistance.

MODES FOR CARRYING OUT THE INVENTION

[Polymer]

A weight-average molecular weight of the polymer having a structural unit of Formula (1) according to the present invention determined by a gel permeation chromatography (hereinafter, abbreviated as GPC) analysis which will be described later is 1,000 to 100,000, and preferably 1,000 to 50,000 in terms of standard polystyrene. The polymer whose weight-average molecular weight is greater than 100,000 may be less soluble to a solvent. In contrast, with the polymer whose weight-average molecular weight is smaller than 1,000, obtained films may be cracked, and the composition may have poor coating properties. When monomers as raw materials of the polymer are, for example, a monosubstituted isocyanuric acid and a dihalogenated compound, ends of the polymer are a hydrogen atom and a halogen atom.

In the structural unit of Formula (1), each of an alkyl group and an alkylene group may be a straight chain or a branched chain. Example of the alkenylene group and the alkynylene group include an ethen-1,2-diyl group (a —CH=CH— group), a 2-butene-1,4-diyl group (—CH$_2$—CH=CH—CH$_2$— group), and an ethyne-1,2-diyl group (a —C≡C— group); examples of the arylene group include a phenylene group, a naphthylene group, and an anthrylene group; and examples of the cyclic alkylene group include a cyclohexylene group. Examples of the halogen atom with which at least one hydrogen atom of the alkylene group is substituted include a fluorine atom, a chlorine atom, and a bromine atom.

The polymer according to the present invention may be composed of only one type of a structural unit of Formula (1), or may be composed of two or more types of structural units of Formula (1) (copolymer).

The following shows examples of groups of $R_1$ in Formula (1). In each of the formulae below, the formula in the parentheses corresponds to $R_1$.

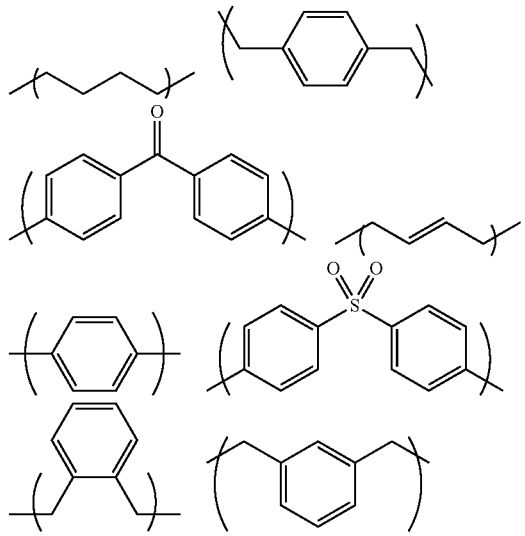

The polymer having a structural unit of Formula (6) according to the present invention may be composed of only one type of a structural unit of Formula (6), or may be composed of two or more types of structural units of Formula (6) (copolymer). The weight-average molecular weight of the polymer determined by GPC analysis is, for example, 1,000 to 100,000 in terms of standard polystyrene. In Formula (6), $R_5$ is a bivalent organic group having a main chain consisting of a carbon atom or a main chain having a carbon atom and at least one of an oxygen atom, a nitrogen atom, and a sulfur atom. In other words, the bivalent organic group has no silicon atom in its main chain. For example, the group is a $C_{1-10}$ bivalent hydrocarbon group or a group of Formula (7):

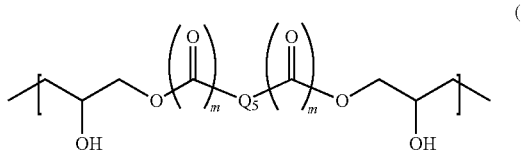
(7)

(where each of two m is independently 0 or 1, and $Q_5$ is a bivalent organic group).

In Formula (6), examples of the bivalent hydrocarbon group include an alkylene group. The bivalent hydrocarbon group can include a phenylene group and a carbonyl group within the limits of the carbon atom number of 1 to 10.

In Formula (7), $Q_5$ is, for example, a $C_{6-14}$ arylene group, a $C_{4-10}$ alicyclic hydrocarbon group, a $C_{2-6}$alkenylene group or a $C_{2-6}$alkynylene group, or a group of Formula (8):

-$A_4$-$Q_6$-$A_5$-  (8)

{where each of $A_4$ and $A_5$ is independently a $C_{6-14}$ arylene group or a $C_{4-10}$ alicyclic hydrocarbon group, and $Q_6$ is a sulfonyl group, a carbonyl group, or an alkylene group of Formula (9):

(9)

(where each of $R_6$ and $R_7$ is independently a $C_1$ or $C_2$ alkyl group, and at least one hydrogen atom of the alkyl group is optionally substituted with a halogen atom)}.

In Formulae (7) and (8), an arylene group is, for example, a phenylene group, and an alicyclic hydrocarbon group is, for example, a cyclohexylene group, but these groups are not necessarily limiting examples. The alicyclic hydrocarbon group may also be, for example, a norbornene-2,3-diyl group or an adamantan-1,3-diyl group because norbornene and adamantan are also alicyclic hydrocarbons.

In Formula (7), examples of the alkenylene group or the alkynylene group include an ethen-1,2-diyl group (a —CH=CH— group), a 2-butene-1,4-diyl group (a —CH$_2$—CH=CH—CH$_2$— group), and an ethyne-1,2-diyl group (a —C≡C— group).

In Formula (9), the alkyl group is, for example, a methyl group in which at least one hydrogen atom may be substituted with a fluorine atom. Examples of the methyl group in which at least one hydrogen atom is substituted with a fluorine atom include a —CF$_3$ group.

The polymer having a structural unit of Formula (6) has, for example, a structural unit of any of Formula (6-1) to Formula (6-9) below, and the polymer having a structural unit of Formula (6) in which $R_5$ is Formula (7) is a polymer having a structural unit of any of Formula (6-2) to Formula (6-8) below.

(6-1)

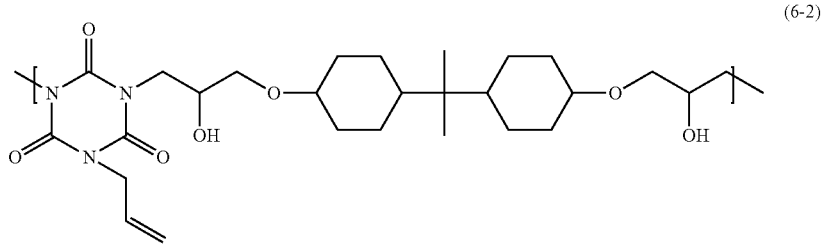
(6-2)

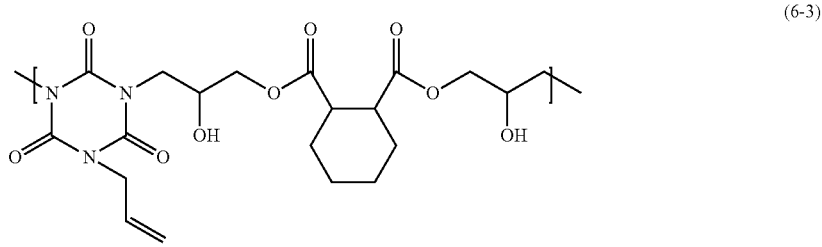
(6-3)

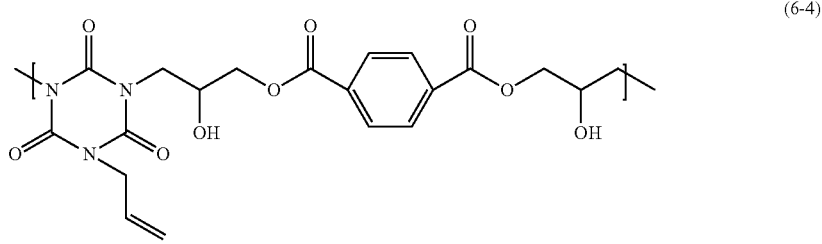
(6-4)

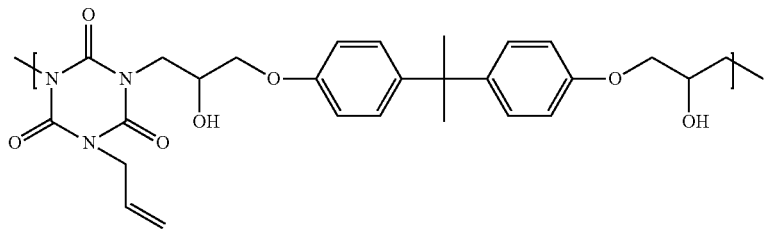

(6-5)

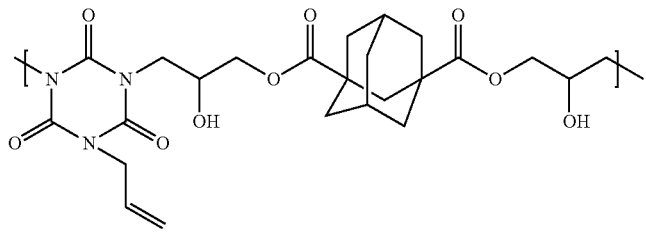

(6-6)

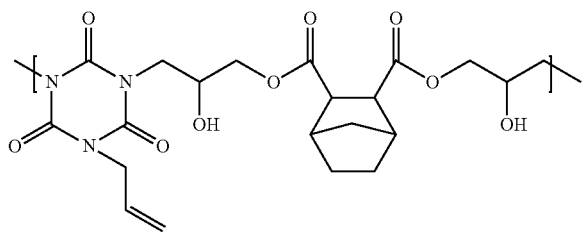

(6-7)

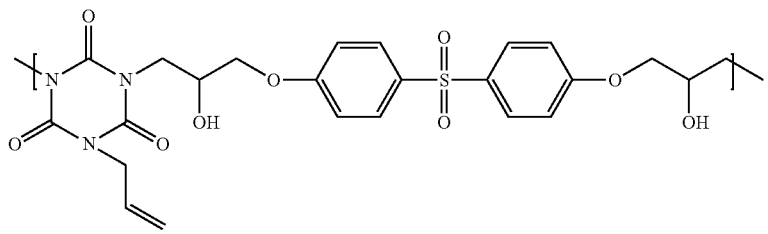

(6-8)

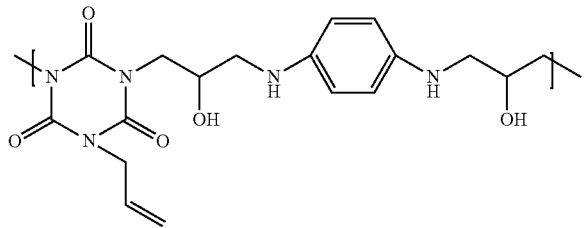

(6-9)

Formulae (6-6)-(6-9)

[Composition Including Polymer]

If desired, a composition including the polymer having a structural unit of Formula (1) according to the present invention may contain at least one of a surfactant, a thermal acid generator, and a solvent in addition to the polymer.

When the composition of the present invention contains a surfactant, examples of the surfactant include: nonionic surfactants including polyoxyethylene alkylethers such as polyoxyethylene lauryl ether, polyoxyethylene stearyl ether, polyoxyethylene cetyl ether, and polyoxyethylene oleyl ether, polyoxyethylene alkylarylethers such as polyoxyethylene octyl phenol ether and polyoxyethylene nonyl phenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine surfactants including Eftop (registered trademark) EF301, Eftop EF303, and Eftop EF352 (manufactured by Mitsubishi Materials Electronic Chemicals Co., Ltd. (former JEMCO Co., Ltd.)), MEGAFAC (registered trademark) F171, MEGAFAC F173, and MEGAFAC R30 (manufactured by DIC Corporation), Fluorad FC430 and Fluorad FC431 (manufactured by Sumitomo 3M Limited), and AsahiGuard (registered trademark) AG710, SURFLON (registered trademark) S-382, SURFLON SC101, SURFLON SC102, SURFLON SC103, SURFLON SC104, SURFLON SC105, and SURFLON SC106

(manufactured by Asahi Glass Co., Ltd.); and organosiloxane polymer KP341 (manufactured by Shin-Etsu Chemical Co., Ltd.). These surfactants may be added alone, or two or more of the surfactants may be added in combination. The mixing amount of the surfactant is, for example, 0.01% by mass to 10% by mass of a total solid content excluding a solvent.

When the composition of the present invention contains a thermal acid generator, examples of the thermal acid generator to be mixed include acid compounds such as p-toluenesulfonic acid, trifluoromethanesulfonic acid, pyridinium-p-toluenesulfonate, salicylic acid, 5-sulfosalicylic acid, citric acid, benzoic acid, and hydroxybenzoic acid; and/or 2,4,4,6-tetrabromocyclohexadienone, benzoin tosylate, and 2-nitrobenzyl tosylate. The mixing amount of the thermal acid generator is, for example, 0.02% by mass to 10% by mass, or 0.04% by mass to 5% by mass of a total solid content excluding a solvent.

When the composition of the present invention contains a solvent, the solvent is not particularly limited as long as it is an organic solvent that can be used in a step for manufacturing semiconductor devices, Preferable examples of the organic solvent available include ketones such as cyclohexanone, methyl isoamyl ketone, 2-butanone, and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol or dipropylene glycol monoacetate, and monomethyl ether, monoethyl ether, monopropyl ether, monobutyl ether, and monophenyl ether; cyclic ethers such as dioxane; lactones such as γ-butyrolactone; and esters such as methyl lactate, ethyl lactate, methyl acetate, ethyl acetate, butyl acetate, methyl pyruvate, ethyl pyruvate, methyl methoxypropionate, and ethyl ethoxypropionate. These may be used alone, or two or more of them may be used as a mixture. When the organic solvent is contained, the percentage of a solid content in the composition of the present invention is, for example, 1% by mass to 70% by mass, in which the solid content refers to ingredients of the composition excluding the organic solvent.

If desired, the composition including a polymer according to the present invention may further contain additives, such as an inorganic filler, a silane coupling agent, a rheology modifier, and a cross-linker, but they are not necessarily contained.

Examples of the inorganic filler include aluminum nitride, boron nitride, alumina, and silica.

Examples of the silane coupling agent include vinyltrimethoxysilane, vinyltriethoxysilane, 3-methacryloxypropyltrimethoxysilane, 3-methacryloxypropyltriethoxysilane, 3-glycidoxypropyltrimethoxysilane, 3-glycidoxypropyltriethoxysilane, 3-aminopropyltrimethoxysilane, and 3-aminopropyltriethoxysilane.

Examples of the rheology modifier include: phthalic acid derivatives such as dimethyl phthalate, diethyl phthalate, diisobutyl phthalate, dihexyl phthalate, and butyl isodecyl phthalate; adipic acid derivatives such as di normal butyl adipate, diisobutyl adipate, diisooctyl adipate, and octyl decyl adipate; maleic acid derivatives such as di normal butyl maleate, diethyl maleate, and dinonyl maleate; oleic acid derivatives such as methyl oleate, butyl oleate, and tetrahydrofurfuryl oleate; and stearic acid derivatives such as normal butyl stearate and glyceryl stearate.

Examples of the cross-linker include nitrogen-containing compounds in which nitrogen atoms are substituted with alkoxymethyl groups such as a methoxymethyl group, an ethoxymethyl group, a butoxymethyl group, and a hexyloxymethyl group, or with hydroxymethyl groups. Further examples of the cross-linker available include epoxy group-containing compounds, epoxy group-containing polymers, allyl group-containing compounds, allyl group-containing polymers, isocyanate group-containing compounds, isocyanate group-containing polymers, and azido group (azi group)-containing compounds.

Examples of the nitrogen-containing compounds include hexamethoxymethyl melamine, tetramethoxymethyl benzoguanamine, 1,3,4,6-tetrakis(butoxymethyl)glycoluril, 1,3,4,6-tetrakis(hydroxymethyl)glycoluril, 1,3-bis(hydroxymethyl)urea, 1,1,3,3-tetrakis(butoxymethyl)urea, 1,1,3,3-tetrakis(methoxymethyl)urea, 1,3-bis(hydroxymethyl)-4,5-dihydroxy-2-imidazolinone, and 1,3-bis(methoxymethyl)-4,5-dimethoxy-2-imidazolinone. Examples of the azido group (azi group)-containing compounds include 2,6-bis(4-azidobenzylidene)-4-methylcyclohexanone and 2,6-bis(4-azidobenzylidene)cyclohexanone.

Further examples of the cross-linker include commercially available compounds such as methoxymethyl-type melamine compounds (trade name: CYMEL (registered trademark) 300, CYMEL 301, CYMEL 303, and CYMEL 350), butoxymethyl-type melamine compounds (trade name: MY COAT (registered trademark) 506 and MY COAT 508), glycoluril compounds (trade name: CYMEL (registered trademark) 1170 and POWDERLINK (registered trademark) 1174), methylated urea resins (trade name: UFR65), butylated urea resins (trade name: UFR300, U-VAN10S60, U-VAN10R, and U-VAN11HV), manufactured by Nihon Cytec Industries Inc.; and urea/formaldehyde resins (highly condensed type, trade name: BECKAMINE (registered trademark) J-300S, BECKAMINE P-955, and BECKAMINE N), manufactured by DIC Corporation.

A compound having, for example, 1 to 6, or 2 to 4 epoxy rings can be used as an epoxy group-containing cross-linker. Examples thereof include 1,4-butanediol diglycidyl ether, 1,2-epoxy-4-(epoxyethyl)cyclohexane, glycerol triglycidyl ether, diethylene glycol diglycidyl ether, 2,6-diglycidylphenylglycidyl ether, 1,1,3-tris[p-(2,3-epoxypropoxy)phenyl] propane, 1,2-cyclohexane dicarboxylic acid diglycidyl ester, 4,4'-methylenebis(N,N-diglycidylaniline), 3,4-epoxycyclohexylmethyl-3,4-epoxycyclohexane carboxylate, trimethylolethane triglycidyl ether, triglycidyl-p-aminophenol, tetraglycidyl metaxylene diamine, tetraglycidyl diaminodiphenylmethane, tetraglycidyl-1,3-bisaminomethyl cyclohexane, bisphenol-A-diglycidyl ether, bisphenol-S-diglycidyl ether, pentaerythritol tetraglycidyl ether, resorcinol diglycidyl ether, phthalic acid diglycidyl ester, neopentyl glycol diglycidyl ether, polypropylene glycol diglycidyl ether, tetrabromobisphenol-A-diglycidyl ether, bisphenol hexafluoroacetone diglycidyl ether, pentaerythritol diglycidyl ether, tris-(2,3-epoxypropyl)isocyanurate, monoallyl-diglycidyl isocyanurate, diglycerol polydiglycidyl ether, pentaerythritol polyglycidyl ether, 1,4-bis(2,3-epoxypropoxyperfluoroisopropyl)cyclohexane, sorbitol polyglycidyl ether, trimethylolpropane polyglycidyl ether, resorcin diglycidyl ether, 1,6-hexanediol diglycidyl ether, polyethylene glycol diglycidyl ether, phenylglycidyl ether, p-tertiary butylphenylglycidyl ether, adipic acid diglycidyl ether, o-phthalic acid diglycidyl ether, dibromophenyl glycidyl ether, 1,2,7,8-diepoxyoctane, 1,6-dimethylol perfluorohexane diglycidyl ether, 4,4'-bis(2,3-epoxypropoxyperfluoroisopropyl)diphenyl ether, 2,2-bis(4-glycidyloxyphenyl) propane, 3,4-epoxycyclohexylmethyl-3',4'-epoxycyclohexane carboxylate, 3,4-epoxycyclohexyl oxirane, 2-(3,4-epoxycyclohexyl)-3',4'-epoxy-1,3-dioxane-5-spirocyclohexane, 1,2-ethylenedioxy-bis(3,4-epoxycyclohexylmethane), 4',5'-epoxy-2'-methylcyclohexylmethyl-4,5-epoxy-2-methylcyclohexane carboxylate, ethylene glycol-bis(3,4-epoxycyclohexane carboxylate), and bis-(3,4-epoxycyclohexylmethyl)adipate, and bis(2,3-epoxycyclopentyl) ether.

These compounds of the cross-linkers can be used alone, or two or more of the compounds can be used in combination. The cross-linker can be used at 1% by mass to 50% by mass, or 8% by mass to 40% by mass, or 15% by mass to 30% by mass of a polymer contained in the composition of the present invention.

The composition comprising a polymer according to the present invention can contain a catalyst for cross-linking. The use of the catalyst for cross-linking facilitates reaction of the cross-linker. Examples of the catalyst for cross-linking include p-toluenesulfonic acid, trifluoromethanesulfonic acid, methanesulfonic acid, pyridinium-p-toluenesulfonate, salicylic acid, camphorsulfonic acid, 5-sulfosalicylic acid, citric acid, benzoic acid, hydroxybenzoic acid, 4-chlorobenzenesulfonic acid, 4-hydroxybenzenesulfonic acid, benzenedisulfonic acid, and 1-naphthalenesulfonic acid.

These catalysts for cross-linking can be used alone, or two or more of the catalysts can be used in combination. The catalyst for cross-linking can be used at 0.01% by mass to 10% by mass, or 0.05% by mass to 8% by mass, or 0.1% by mass to 5% by mass, or 0.3% by mass to 3% by mass, or 0.5% by mass to 1% by mass of the polymer contained in the composition of the present invention.

Conventionally used miscible additives, such as an additional resin for improving performance of the composition, a tackifier, a plasticizer, an adhesion auxiliary agent, a stabilizer, a colorant, and an antifoaming agent can further be added to the composition comprising a polymer according to the present invention, as long as these additives do not affect essential properties of the present invention.

Addition polymerization polymers or condensation polymerization polymers, such as polyester, polystyrene, polyimide, an acrylic polymer, a methacrylic polymer, polyvinyl ether, phenol novolac, naphthol novolac, polyether, polyamide, and polycarbonate can be used as the additional resin (polymer) for improving performance of the composition. Preferably used are polymers having aromatic ring structures such as a benzene ring, a naphthalene ring, an anthracene ring, a triazine ring, a quinoline ring, and a quinoxaline ring.

Examples of the additional resin (polymer) include: an addition polymerization polymer having an addition polymerization monomer such as benzyl acrylate, benzyl methacrylate, phenyl acrylate, naphthyl acrylate, anthryl methacrylate, anthrylmethyl methacrylate, styrene, hydroxy styrene, benzylvinyl ether, and N-phenyl maleimide, as a structural unit thereof; and a condensation polymerization polymer such as phenol novolac and naphthol novolac. A polymer having no aromatic ring structure can also be used as the additional resin (polymer). Example of such a polymer includes an addition polymerization polymer containing only an addition polymerization monomer having no aromatic ring structure as a structural unit thereof, such as alkyl acrylate, alkyl methacrylate, vinyl ether, alkylvinyl ether, acrylonitrile, maleimide, N-alkyl maleimide, and maleic acid anhydride. When an addition polymerization polymer is used as an additional resin (polymer), the polymer may be a homopolymer or a copolymer.

A weight-average molecular weight of an additional resin (polymer) used for the composition including a polymer according to the present invention is, for example, 1,000 to 1,000,000, or 3,000 to 300,000, or 5,000 to 200,000, or 10,000 to 100,000. When an additional resin (polymer) is contained in the composition of the present invention, the content thereof is, for example, 40% by mass or less, or 20% by mass or less, or 1% by mass to 19% by mass of the solid content.

The tackifier is added to control modulus of elasticity, viscosity, and surface condition. The type of the tackifier is preferably decided by taking into account viscosity. Specific examples thereof include one of, or a combination of two or more of an aliphatic petroleum resin, an aromatic petroleum resin, an aliphatic and aromatic copolymerization petroleum resin, a hydrogenerated alicyclic petroleum resin, an alkyl phenol resin, a xylene resin, a coumarone indene resin, a terpene resin, a terpene phenol resin, an aromatic denatured terpene resin, a hydrogenated terpene resin, a rosin resin, a hydrogenerated rosin resin, a disproportionated rosin resin, a dimerized rosin resin, and an esterified rosin resin. The tackifier can be contained at a percentage of, for example, 100% by mass or less, or 50% by mass or less of the polymer contained in the composition of the present invention.

The composition including a polymer according to the present invention is used for adhesives, formation of insulating films, or formation of resist underlayer films. Such adhesives are used, for example, in a process of forming three-dimensional stacked bodies, such as IC chips, in order to bond between stacked materials. In the formation of insulating films, for example, gate insulating films or interlayer insulating films of thin film transistors are formed. In the formation of resist underlayer films, for example, a resist underlayer film is formed between a substrate and a resist film in order that a resist pattern having a desired shape is formed on the substrate.

When the composition contains a solvent, the composition is used for insulating inks. Insulating inks are used, for example, in a process for manufacturing flexible displays in which plastic substrates are used, to form insulating films by methods such as screen printing and ink jet.

[Adhesive Composition]

The adhesive composition of the present invention contains the polymer having a structural unit of Formula (6) and a solvent as essential ingredients. The polymer may be composed of only one type of a structural unit of Formula (6), or may be composed of two or more types of structural units of Formula (6) (copolymer). The weight-average molecular weight of the polymer determined by GPC analysis is, for example, 1,000 to 100,000 in terms of standard polystyrene. The definition of each group in a structural unit of Formula (6) is described above.

The adhesive composition of the present invention can be prepared as a coating solution in which a polymer of Formula (6) is dissolved in an organic solvent so that the solution can be used for spin coating within the range from 0.001 to 5,000 Pa·s in viscosity.

The organic solvent is not particularly limited as long as it can be used in a step for manufacturing semiconductor devices. Preferable examples of the organic solvent available include: ketones such as cyclohexanone, methyl isoamyl ketone, 2-butanone, and 2-heptanone; polyhydric alcohols and derivatives thereof, such as ethylene glycol, ethylene glycol monoacetate, diethylene glycol, diethylene glycol monoacetate, propylene glycol, propylene glycol monoacetate, dipropylene glycol, and dipropylene glycol monoacetate, as well as monomethyl ether, monoethyl ether, monopropyl ether, monobutyl ether, and monophenyl ether of these; cyclic ethers such as dioxane; lactones such as γ-butyrolactone; and esters such as methyl lactate, ethyl lactate, methyl acetate, ethyl acetate, butyl acetate, methyl pyruvate, ethyl pyruvate, methyl methoxypropionate, and ethyl ethoxypropionate. These may be used alone, or two or more of them may be used as a mixture.

The percentage of a solid content in the adhesive composition of the present invention is, for example, 1% by mass to 70% by mass, in which the solid content refers to ingredients of the adhesive composition excluding the organic solvent.

If necessary, the adhesive composition of the present invention may further contain additives such as a surfactant, a thermal acid generator, an inorganic filler, a silane coupling agent, a rheology modifier, a cross-linker, and a catalyst for cross-linking.

As these additives, various specific compounds described in the section [Composition Including Polymer] above as examples of a surfactant, a thermal acid generator, an inorganic filler, a silane coupling agent, a rheology modifier, a cross-linker, and a catalyst for cross-linking can be used in the amounts described above.

Conventionally used miscible additives, such as an additional resin for improving performance of an adhesive, a tackifier, a plasticizer, an adhesion auxiliary agent, a stabilizer, a colorant, and an antifoaming agent, can further be added to the adhesive composition of the present invention as long as these additives do not affect essential properties of the present invention.

Specific compounds described in the section [Composition Including Polymer] above as examples can also be used as these additives in the amounts described above.

EXAMPLES

The present invention will be explained in further detail according to examples; however, the present invention is not limited to these examples.

Gel permeation chromatography (GPC) analyses of polymers obtained in synthesis examples described below were conducted with the following device and measuring condition.

Device: All-in-one high-speed GPC system, HLC-8220GPC, manufactured by Tosoh Corporation
Column: KF-G, KF804L
Column temperature: 40° C.
Solvent: tetrahydrofuran (THF)
Flow rate: 1.0 mL/minute
Standard sample: polystyrene
Detector: RI Synthesis Example 1

10.0 g of sodium hydride (60% by mass contained in oil paraffin) was suspended in 200 g of N-methyl-2-pyrrolidone, and then 21.9 g of monobutyl isocyanurate was added thereto by split addition. The mixture was heated to 40° C., and agitated for 1 hour. After that, 25.5 g of 1,4-dibromobutane was added slowly, and the resultant mixture was reacted at 100° C. for 2 hours. The reaction was then stopped with water to precipitate a polymer. Next, reprecipitation was conducted to obtain a polymer having a structural unit of Formula [A] below. GPC analysis of the obtained polymer showed a weight-average molecular weight of 7,100 in terms of standard polystyrene.

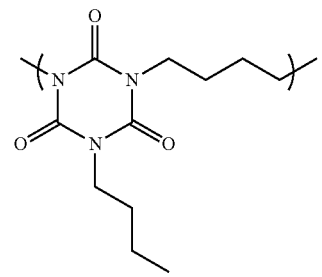

Synthesis Example 2

10.0 g of sodium hydride (60% by mass contained in oil paraffin) was suspended in 200 g of N-methyl-2-pyrrolidone, and then 19.5 g of monoallyl isocyanurate was added thereto by split addition. The mixture was heated to 40° C., and agitated for 1 hour. After that, 15.0 g of 1,4-dichloro butane was added slowly, and the resultant mixture was reacted at 90° C. for 24 hours. The reaction was then stopped with water to precipitate a polymer. Next, reprecipitation was conducted to obtain a polymer having a structural unit of Formula [B] below. GPC analysis of the obtained polymer showed a weight-average molecular weight of 4,000 in terms of standard polystyrene.

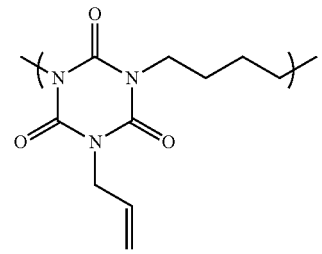

Synthesis Example 3

8 g of the polymer obtained in Synthesis Example 2 was dissolved in 32 g of methylene chloride, and then 9.3 g (0.054 mol) of m-chloroperoxybenzoic acid was added thereto by split addition. The mixture was reacted under a nitrogen atmosphere, at room temperature for 2 days. After that, the obtained reaction solution was added dropwise into a mixed solvent of diethyl ether/methanol, and then the precipitate was filtered to obtain white powder. GPC analysis of the reaction product showed a weight-average molecular weight of 5,200 in terms of standard polystyrene. The inversion rate from allyl to epoxy was 52%. The obtained reaction product was a polymer having structural units of two formulae in Formula [C]:

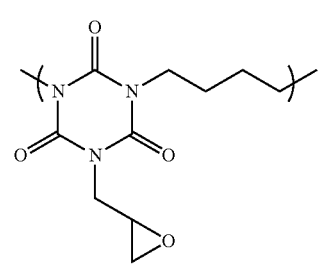

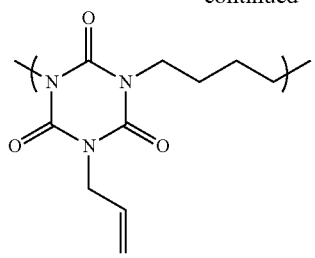

Synthesis Example 4

67.66 g of monoallyl isocyanurate, 74.39 g of 1,2-dibromoethane, 121.62 g of potassium carbonate, and 213.07 g of N-methyl-2-pyrrolidone were placed in a flask equipped with an agitator, a reflux apparatus, and a thermometer. The air in the flask was replaced with nitrogen, and then the mixture was heated to 70° C. and reacted for 20 hours. After that, the solution was cooled to room temperature, and then was filtered to collect a filtrate. A mixed solution in which N-methyl-2-pyrrolidone and 1 mol/L hydrochloric acid were mixed at a volume ratio of 90:10 was added to the filtrate until the pH became acidic. Next, reprecipitation purification was conducted by pouring the mixture into methanol to obtain a polymer having a structural unit of Formula [D] below. GPC analysis of the obtained polymer showed a weight-average molecular weight of 9,500 in terms of standard polystyrene.

[D]

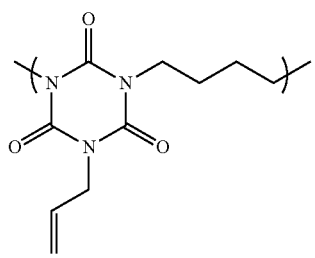

Synthesis Example 5

67.66 g of monoallyl isocyanurate, 77.73 g of 1,4-dibromobutane, 121.62 g of potassium carbonate, and 581.53 g of N-methyl-2-pyrrolidone were placed in a flask equipped with an agitator, a reflux apparatus, and a thermometer. The air in the flask was replaced with nitrogen, and then the mixture was heated to 70° C. and reacted for 20 hours. After that, the solution was cooled to room temperature, and then was filtered to collect a filtrate. A mixed solution in which N-methyl-2-pyrrolidone and 1 mol/L hydrochloric acid were mixed at a volume ratio of 90:10 was added to the filtrate until the pH became acidic. Next, reprecipitation purification was conducted by pouring the mixture into methanol to obtain a polymer having a structural unit of Formula [E] below. GPC analysis of the obtained polymer showed a weight-average molecular weight of 9,500 in terms of standard polystyrene.

[E]

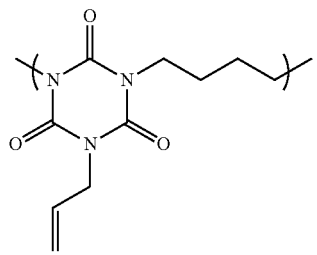

Synthesis Example 6

67.66 g of monoallyl isocyanurate, 87.83 g of 1,6-dibromohexane, 121.62 g of potassium carbonate, and 621.94 g of N-methyl-2-pyrrolidone were placed in a flask equipped with an agitator, a reflux apparatus, and a thermometer. The air in the flask was replaced with nitrogen, and then the mixture was heated to 70° C. and reacted for 20 hours. After that, the solution was cooled to room temperature, and then was filtered to collect a filtrate. A mixed solution in which N-methyl-2-pyrrolidone and 1 mol/L hydrochloric acid were mixed at a volume ratio of 90:10 was added to the filtrate until the pH became acidic. Next, the mixture was poured into a two-layer separation solution of ethyl acetate and water, and a liquid separation operation was performed. Only a target polymer was extracted in an ethyl acetate layer, and then ethyl acetate was distilled with an evaporator to obtain a polymer having a structural unit of Formula [F] below. GPC analysis of the obtained polymer showed a weight-average molecular weight of 5,600 in terms of standard polystyrene.

[F]

Synthesis Example 7

11.84 g of monoallyl isocyanurate, 17.14 g of 1,8-dibromooctane, 21.28 g of potassium carbonate, and 115.91 g of N-methyl-2-pyrrolidone were placed in a flask equipped with an agitator, a reflux apparatus, and a thermometer. The air in the flask was replaced with nitrogen, and then the mixture was heated to 70° C. and reacted for 20 hours. After that, the solution was cooled to room temperature, and then was filtered to collect a filtrate. A mixed solution in which N-methyl-2-pyrrolidone and 1 mol/L hydrochloric acid were mixed at a volume ratio of 90:10 was added to the filtrate until the pH became acidic. Next, the mixture was poured into a two-layer separation solution of ethyl acetate and water, and a liquid separation operation was performed. Only a target polymer was extracted in an ethyl acetate layer, and then ethyl acetate was distilled with an evaporator to obtain a polymer having a structural unit of Formula [G] below. GPC analysis of the obtained polymer showed a weight-average molecular weight of 11,300 in terms of standard polystyrene.

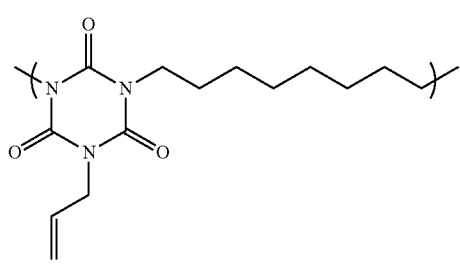

[G]

Synthesis Example 8

11.84 g of monoallyl isocyanurate, 17.14 g of 1,10-dibromodecane, 21.28 g of potassium carbonate, and 115.91 g of N-methyl-2-pyrrolidone were placed in a flask equipped with an agitator, a reflux apparatus, and a thermometer. The air in the flask was replaced with nitrogen, and then the mixture was heated to 70° C. and reacted for 20 hours. After that, the solution was cooled to room temperature, and then was filtered to collect a filtrate. A mixed solution in which N-methyl-2-pyrrolidone and 1 mol/L hydrochloric acid were mixed at a volume ratio of 90:10 was added to the filtrate until the pH became acidic. Next, the mixture was poured into a two-layer separation solution of ethyl acetate and water, and a liquid separation operation was performed. Only a target polymer was extracted in an ethyl acetate layer, and then ethyl acetate was distilled with an evaporator to obtain a polymer having a structural unit of Formula [H] below. GPC analysis of the obtained polymer showed a weight-average molecular weight of 10,600 in terms of standard polystyrene,

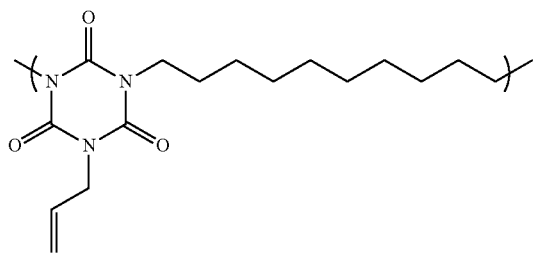

[H]

Synthesis Example 9

11.84 g of monoallyl isocyanurate, 12.13 g of p-dichloro xylene, 21.28 g of potassium carbonate, and 95.89 g of N-methyl-2-pyrrolidone were placed in a flask equipped with an agitator, a reflux apparatus, and a thermometer. The air in the flask was replaced with nitrogen, and then the mixture was heated to 70° C. and reacted for 20 hours. After that, the solution was cooled to room temperature, and then was filtered to collect a filtrate. A mixed solution in which N-methyl-2-pyrrolidone and 1 mol/L hydrochloric acid were mixed at a volume ratio of 90:10 was added to the filtrate until the pH became acidic. Next, reprecipitation purification was conducted by pouring the mixture into methanol to obtain a polymer having a structural unit of Formula [I] below. GPC analysis of the obtained polymer showed a weight-average molecular weight of 17,000 in terms of standard polystyrene.

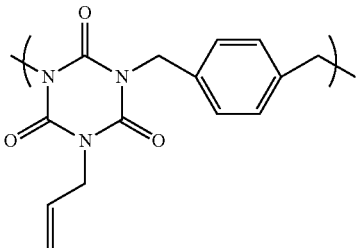

[I]

Synthesis Example 10

12.89 g of diethylbarbituric acid, 13.02 g of 1,4-dibromoethane, 21.28 g of potassium carbonate, and 103.65 g of N-methyl-2-pyrrolidone were placed in a flask equipped with an agitator, a reflux apparatus, and a thermometer. The air in the flask was replaced with nitrogen, and then the mixture was heated to 70° C. and reacted for 20 hours. After that, the solution was cooled to room temperature, and then was filtered to collect a filtrate. A mixed solution in which N-methyl-2-pyrrolidone and 1 mol/L hydrochloric acid were mixed at a volume ratio of 90:10 was added to the filtrate until the pH became acidic. Next, reprecipitation purification was conducted by pouring the mixture into methanol to obtain a polymer having a structural unit of Formula [J] below. GPC analysis of the obtained polymer showed a weight-average molecular weight of 2,400 in terms of standard polystyrene.

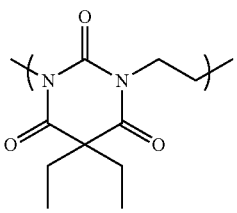

[J]

Synthesis Example 11

11.84 g of monoallyl isocyanurate, 14.83 g of 1,4-dibromo-2-butene, 21.28 g of potassium carbonate, and 106.65 g of N-methyl-2-pyrrolidone were placed in a flask equipped with an agitator, a reflux apparatus, and a thermometer. The air in the flask was replaced with nitrogen, and then the mixture was heated to 70° C and reacted for 20 hours. After that, the solution was cooled to room temperature, and then was filtered to collect a filtrate. A mixed solution in which N-methyl-2-pyrrolidone and 1 mol/L hydrochloric acid were mixed at a volume ratio of 90:10 was added to the filtrate until the pH became acidic. Next, reprecipitation purification was conducted by pouring the mixture into methanol to obtain a polymer having a structural unit of Formula [K] below. GPC analysis of the obtained polymer showed a weight-average molecular weight of 8,900 in terms of standard polystyrene.

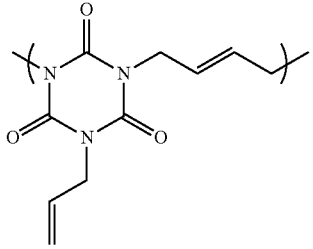

[K]

Synthesis Example 12

16.91 g of monoallyl isocyanurate, 12.57 g of 1,3-dichloro-2-propanone, 30.41 g of potassium carbonate, and 88.45 g of N-methyl-2-pyrrolidone were placed in a flask equipped with an agitator, a reflux apparatus, and a thermometer. The air in the flask was replaced with nitrogen, and then the mixture was heated to 70° C. and reacted for 20 hours. After that, the solution was cooled to room temperature, and then was filtered to collect a filtrate. A mixed solution in which N-methyl-2-pyrrolidone and 1 mol/L hydrochloric acid were mixed at a volume ratio of 90:10 was added to the filtrate until the pH became acidic. Next, reprecipitation purification was conducted by pouring the mixture into methanol to obtain a polymer having a structural unit of Formula [L] below. GPC analysis of the obtained polymer showed a weight-average molecular weight of 1,300 in terms of standard polystyrene.

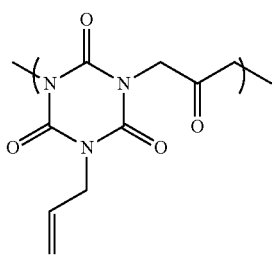

[L]

Synthesis Example 13

25.37 g of monoallyl isocyanurate, 22.32 g of o-dichloro xylene, 45.61 g of potassium carbonate, and 111.28 g of N-methyl-2-pyrrolidone were placed in a flask equipped with an agitator, a reflux apparatus, and a thermometer. The air in the flask was replaced with nitrogen, and then the mixture was heated to 70° C. and reacted for 20 hours. After that, the solution was cooled to room temperature, and then was filtered to collect a filtrate. A mixed solution in which N-methyl-2-pyrrolidone and 1 mol/L hydrochloric acid were mixed at a volume ratio of 90:10 was added to the filtrate until the pH became acidic. Next, reprecipitation purification was conducted by pouring the mixture into methanol to obtain a polymer having a structural unit of Formula [M] below. GPC analysis of the obtained polymer showed a weight-average molecular weight of 7,800 in terms of standard polystyrene.

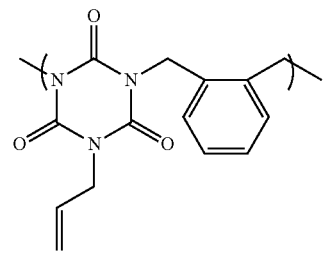

[M]

Synthesis Example 14

84.57 g of monoallyl isocyanurate, 39.38 g of m-dichloro xylene, 45.99 g of 1,5-dibromo pentane, 6.05 g of allyl bromide, 106.62 g of potassium carbonate, and 410.66 g of N-methyl-2-pyrrolidone were placed in a flask equipped with an agitator, a reflux apparatus, and a thermometer. The air in the flask was replaced with nitrogen, and then the mixture was heated to 70° C. and reacted for 20 hours. After that, the solution was cooled to room temperature, and then was filtered to collect a filtrate. A mixed solution in which N-methyl-2-pyrrolidone and 1 mol/L hydrochloric acid were mixed at a volume ratio of 90:10 was added to the filtrate until the pH became acidic. Next, reprecipitation purification was conducted by pouring the mixture into methanol to obtain a polymer having structural units of two formulae in Formula [N] below, at a molar ratio of 50:50. GPC analysis of the obtained polymer showed a weight-average molecular weight of 3,900 in terms of standard polystyrene.

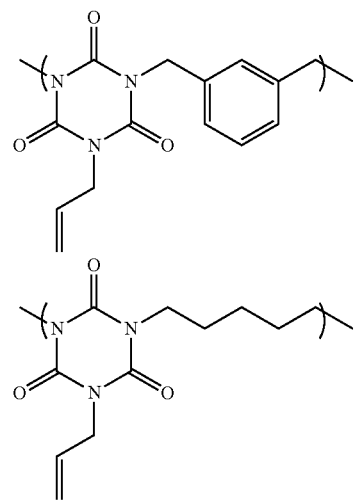

[N]

Comparative Synthesis Example 1

21.22 g of diallyl monoglycidyl isocyanurate, 10.64 g of 1,1,3,3-tetramethyldisiloxane, and 20 μL of Karstedt's catalyst (0.1 M xylene solution of platinum(0)-1,3-divinyl-1,1,3,3-tetramethyldisiloxane complex) were placed in a flask equipped with an agitator, a reflux apparatus, and a thermometer. The air in the flask was replaced with nitrogen, and then the mixture was reacted at 70° C. for 1 hour and at 90° C. for 20 hours to obtain a polymer having a structural unit of Formula [X] below. GPC analysis of the obtained polymer showed a weight-average molecular weight of 7,800 in terms of standard polystyrene.

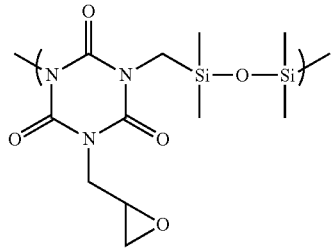

[X]

Comparative Synthesis Example 2

18.57 g of diallyl monoglycidyl isocyanurate, 19.59 g of 1,1,3,3,5,5,7,7-octamethyltetrasiloxane, and 20 μL of Karstedt's catalyst (0.1 M xylene solution of platinum(0)-1,3-divinyl-1,1,3,3-tetramethyldisiloxane complex) were placed in a flask equipped with an agitator, a reflux apparatus, and a thermometer. The air in the flask was replaced with nitrogen, and then the mixture was reacted at 70° C. for 1 hour and at 150° C. for 20 hours to obtain a polymer having a structural unit of Formula [Y] below. GPC analysis of the obtained polymer showed a weight-average molecular weight of 5,500 in terms of standard polystyrene.

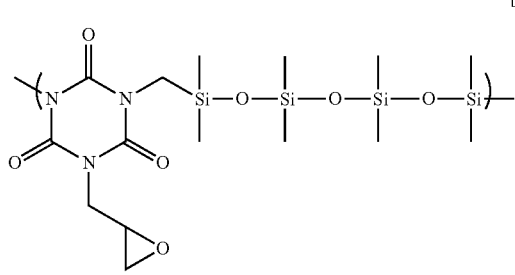

[Y]

Example 1

A solution was prepared by dissolving 1 g of the polymer obtained in Synthesis Example 1 and 0.01 g of MEGAFAC (registered trademark) R-30 (manufactured by DIC Corporation) as a surfactant into 2.0 g of propylene glycol monomethyl ether, 2.0 g of propylene glycol monomethyl ether acetate, and 1 g of γ-butyrolactone. Then, the solution was filtered through a polyethylene micro filter having a pore size of 0.10 μm to prepare a composition.

Example 2

With the exception that the polymer obtained in Synthesis Example 2 was used instead of the polymer obtained in Synthesis Example 1, a composition was prepared in the same manner as Example 1.

Example 3

A solution was prepared by dissolving 1 g of the polymer obtained in Synthesis Example 3, 0.01 g of MEGAFAC (registered trademark) R-30 (manufactured by DIC Corporation) as a surfactant, and 0.03 g of TAG-N (manufactured by SANSHIN CHEMICAL INDUSTRY CO., LTD.) as a thermal acid generator into 2.0 g of propylene glycol monomethyl ether, 2.0 g of propylene glycol monomethyl ether acetate, and 1 g of γ-butyrolactone. Then, the solution was filtered through a polyethylene micro filter having a pore size of 0.10 μm to prepare a composition.

Example 4

The polymer obtained in Synthesis Example 4 was dissolved in cyclohexanone, and the solution was then filtered through a polytetrafluoroethylene (hereinafter, abbreviated as PTFE) micro filter having a pore size of 1.0 μm to prepare a composition in which the percentage of the solid content was 35% by mass.

Example 5

With the exception that the polymer obtained in Synthesis Example 5 was used instead of the polymer obtained in Synthesis Example 4, a composition was prepared in the same manner as Example 4.

Example 6

With the exception that the polymer obtained in Synthesis Example 6 was used instead of the polymer obtained in Synthesis Example 4, a composition was prepared in the same manner as Example 4.

Example 7

With the exception that the polymer obtained in Synthesis Example 7 was used instead of the polymer obtained in Synthesis Example 4, a composition was prepared in the same manner as Example 4.

Example 8

With the exception that the polymer obtained in Synthesis Example 8 was used instead of the polymer obtained in Synthesis Example 4, a composition was prepared in the same manner as Example 4.

Comparative Example 1

A solution was prepared by adding 0.01 g of MEGAFAC (registered trademark) R-30 (manufactured by DIC Corporation) as a surfactant to 5 g of a poly(pyromellitic dianhydride-co-4,4'-oxydianiline) amic acid solution (Pyre-ML RC-5019, 16% by mass N-methyl-2-pyrrolidone solution, manufactured by Sigma-Aldrich Japan K.K.) that is a polyimide precursor. Then the solution was filtered through a polyethylene micro filter having a pore size of 0.10 μm to prepare a composition.

Comparative Example 2

The polymer obtained in Comparative Synthesis Example 1 was dissolved in cyclohexanone. To the resultant solution, a thermal acid generator, K-PURE TAG 2689 (manufactured by King Industries Inc.) was then added at 1% by mass of the mass of the polymer. The solution was filtered through a PTFE micro filter having a pore size of 1.0 µm to prepare a composition in which the percentage of the solid content was 35.35% by mass.

Comparative Example 3

The polymer obtained in Comparative Synthesis Example 2 was dissolved in cyclohexanone. To the resultant solution, a thermal acid generator, K-PURE TAG 2689 (manufactured by King Industries Inc.) was then added at 1% by mass of the mass of the polymer. The solution was filtered through a PTFE micro filter having a pore size of 1.0 µm to prepare a composition in which the percentage of the solid content was 40.40% by mass.

Comparative Example 4

Polymethylmethacrylate (manufactured by Wako Pure Chemical Industries, Ltd.) that is an acrylic resin was dissolved in cyclohexanone, and then the solution was filtered through a PTFE micro filter having a pore size of 1.0 µm to prepare a composition in which the percentage of the solid content was 20% by mass.

[Measurement of Transmittance]

The compositions prepared in Examples 1 to 3, and Comparative Example 1 were applied to respective quartz substrates by use of a spin coater. Each of the substrates was baked at 200° C. for 5 minutes on a hot plate to form a film having a thickness of 0.75 am. A transmittance of the film at a wavelength of 400 nm was measured by use of an ultraviolet-visible spectrophotometer UV-2550 (manufactured by SHIMADZU Corporation). The film was further heated at 260° C. for 3 minutes, and then its transmittance at a wavelength of 400 nm was measured. Table 1 below shows the results of the measurement. As shown in Table 1, the results suggest that the films obtained from compositions of the present invention have higher transmittances compared to the film obtained from the composition of Comparative Example, keep high transmittances even at a high temperature such as 260° C. almost without coloring, and are heat resistant.

TABLE 1

|  | Transmittance (Wavelength 400 nm) | |
| --- | --- | --- |
|  | 200° C. | 260° C. |
| Example 1 | 100% | 98% |
| Example 2 | 100% | 99% |
| Example 3 | 100% | 99% |
| Comparative Example 1 | 88% | 87% |

[Light Resistance Test]

The compositions prepared in Examples 1 to 3 were applied to respective quartz substrates by use of a spin coater. Each of the substrates was baked at 220° C. for 5 minutes on a hot plate to form a film having a thickness of 0.75 µm, A light resistance test (JIS B7754) with a xenon arc lamp was conducted to each of these films for 24 hours, and then a transmittance of the film at a wavelength of 400 nm was measured by use of an ultraviolet-visible spectrophotometer UV-2550 (manufactured by SHIMADZU Corporation). Table 2 below shows the results of the measurement. As shown in Table 2, the results show that the films obtained from the compositions of the present invention have high transmittances even after the ultraviolet irradiation, and are highly light resistant (hard to be colored).

TABLE 2

|  | Transmittance (Wavelength 400 nm) | |
| --- | --- | --- |
|  | Before Irradiation | After Irradiation |
| Example 1 | 100% | 100% |
| Example 2 | 100% | 100% |
| Example 3 | 100% | 100% |

[Test of Elution to Solvent]

The compositions prepared in Example 3 and Comparative Example 1 were applied to respective silicon wafers by use of a spin coater. Each of the silicon wafers was baked at 200° C. for 5 minutes on a hot plate to form a film having a thickness of 1 µm. The film was soaked in acetone, N-methyl-2-pyrrolidone, 2-propanol, and 2-heptanone, each at 23° C. for 10 minutes. It was confirmed that in the film obtained from the composition of Example 3, the film thickness was changed by 5% or less before and after soaking. In contrast, the film obtained from the composition of Comparative Example 1 was completely dissolved after being soaked in N-methyl-2-pyrrolidone.

[Evaluation of Reworkability]

The compositions prepared in Examples 4 to 6, and Comparative Examples 2 and 3 were applied to respective silicon wafers by use of a spin coater. Each of the silicon wafers was baked at 100° C. for 2 minutes, and 150° C. for 2 minutes on a hot plate, and was further baked in an oven in which the air was replaced with nitrogen, at 250° C. for 1 hour to form a film. Etching was conducted for 2 minutes by use of a reactive ion etching device (RIE-10NR, manufactured by SAMCO INC.) under an oxygen flow rate of 50 sccm, a pressure of 12 Pa, and an RF output of 250 W. Reworkability of each of the films was evaluated from a decreased amount of a film thickness per minute. Table 3 below shows the results. As shown in Table 3, the films obtained from the compositions of the present invention have excellent reworkability because the films can be easily removed by etching. In contrast, the films obtained from the compositions of the Comparative Examples are not reworkable because the films were almost impossible to be removed.

TABLE 3

|  | Decreased Amount of Film Thickness |
| --- | --- |
| Example 4 | 725 nm/minute |
| Example 5 | 732 nm/minute |
| Example 6 | 690 nm/minute |
| Comparative Example 2 | 18 nm/minute |
| Comparative Example 3 | 14 nm/minute |

[Evaluation of Insulation Performance]

Cyclohexanone was added to the compositions prepared in Examples 4 to 8, and Comparative Example 4 to form respective dilute solutions so that films formed on silicon wafers by use of a spin coater have a film thickness of 500 nm. The prepared dilute solutions were applied to respective silicon wafers by use of a spin coater. Each of the silicon wafers was baked at 100° C. for 2 minutes, and 150° C. for 2 minutes on a hot plate, and was further baked in an oven in which the air was replaced with nitrogen at 250° C. for 1 hour to form a film. A voltage of 2 MV/cm was applied to each of the films by use of a mercury probe (CVmap 92-B, manufactured by Four Dimensions Inc.), and the leakage current value was measured to evaluate the insulation performance of the film. Table 4 below shows the results. As shown in Table 4, the films obtained from the compositions of the present invention show low leakage current values, and thus their insulation performances are high. In contrast, the film obtained from the composition of the Comparative Example shows a high leakage current value, and thus its insulation performance is low.

TABLE 4

|  | Leakage Current Value (A/cm$^2$) |
|---|---|
| Example 4 | 2.45 × 10$^{-9}$ |
| Example 5 | 1.09 × 10$^{-9}$ |
| Example 6 | 1.65 × 10$^{-9}$ |
| Example 7 | 0.90 × 10$^{-9}$ |
| Example 8 | 0.85 × 10$^{-9}$ |
| Comparative Example 4 | 14.43 × 10$^{-9}$ |

[Evaluation of Heat Resistance]

The compositions prepared in Examples 4 to 8, and Comparative Example 4 were applied to respective silicon wafers by use of a spin coater. Each of the silicon wafers was baked at 100° C. for 2 minutes, and 150° C. for 2 minutes on a hot plate to form a film. The film was subjected to temperature rising by 10° C./minute by TG-DTA (TG/DTA2010SR, manufactured by Bruker AXS K.K.), and a heat resistance was evaluated from a temperature that induced mass decrease of 5% by mass. Table 5 below shows the results. As shown in Table 5, temperatures that induced mass decrease of the films obtained from the compositions of the present invention were high. Thus the heat resistance of the films obtained from the compositions of the present invention is higher than that of the film obtained from the composition of the Comparative Example.

TABLE 5

|  | Temperature That Induced Mass Decrease of 5% by mass |
|---|---|
| Example 4 | 437° C. |
| Example 5 | 420° C. |
| Example 6 | 419° C. |
| Example 7 | 430° C. |
| Example 8 | 405° C. |
| Comparative Example 4 | 323° C. |

[Evaluation of Adhesiveness]
(Preparation of Sample for Evaluation of Adhesive Force)

The compositions prepared in Examples 4 and 5 were applied to respective silicon wafers having a diameter of 4 inches by use of a spin coater so that films having a thickness of 5 μm were formed. Each of the silicon wafers was baked at 100° C. for 2 minutes, and 150° C. for 2 minutes on a hot plate to form a film. Then the film formed on the silicon wafer was bonded to a glass wafer having a diameter of 4 inches by use of a bonding system (VJ-300, manufactured by Ayumi Industries Company Limited), under a vacuum of 10 Pa or less, a temperature of 160° C., and a bonding pressure of 400 kg. Next, the bonded wafers were baked in an oven at 250° C. for 1 hour, and were cut into 1 square centimeter with a dicing saw (DAD321, manufactured by DISCO Corporation) to prepare a sample for evaluating adhesive force.

The composition prepared in Comparative Example 4 was applied to a silicon wager having a diameter of 4 inches by use of a spin coater so that a film having a thickness of 5 μm was formed. The silicon wafer was baked at 100° C. for 2 minutes, and 200° C. for 2 minutes on a hot plate to form a film. Then the film formed on the silicon wafer was bonded to a glass wafer having a diameter of 4 inches by use of a bonding system (VJ-300, manufactured by Ayumi Industries Company Limited), under a vacuum of 10 Pa or less, a temperature of 270° C., and a bonding pressure of 400 kg. Next, the bonded wafers were cut into 1 square centimeter with a dicing saw (DAD321, manufactured by DISCO Corporation) to prepare a sample for evaluating adhesive force.

(Evaluation of Adhesive Force)

Araldite (registered trademark) 2014 (manufactured by Huntsman Advanced Materials LLC) was applied to both surfaces of each of the samples that were prepared with compositions of Examples 4 and 5, and Comparative Example 4 for evaluating adhesive force. Then both of the surfaces were bonded to a dedicated jig for adhesive force (shear) measurement, and adhesive force (shear) was tested and evaluated by use of Autograph (Autograph AGS-100NX, manufactured by SHIMADZU Corporation). Adhesive force was measured at a tension speed of 1 mm/minute. Table 6 below shows the results. In Table 6, a value of adhesive force "1000 N or greater" means that the value of adhesive force is equal to or greater than the measurement limit of the adhesive force measuring instrument (test device). The samples obtained with the compositions of Examples 4 and 5 showed higher adhesive force than that of the sample obtained with the composition of Comparative Example 4.

TABLE 6

|  | Adhesive Force (Shear) |
|---|---|
| Example 4 | 1000 N or greater |
| Example 5 | 1000 N or greater |
| Comparative Example 4 | 708 N |

Synthesis Example 15

25.00 g of 1,2-cyclohexane dicarboxylic acid glycidyl ester, 15.43 g of monoallyl isocyanurate, and 0.93 g of benzyl triethyl ammonium chloride were dissolved in 62.05 g of cyclohexanone, and then the solution was reacted at 140° C. for 4 hours to obtain a solution containing a polymer. GPC analysis of the obtained polymer showed a weight-average molecular weight of 5,500 in terms of standard polystyrene. The obtained polymer seems to have a structural unit of Formula [O] below, and have a hydrogen atom on its end.

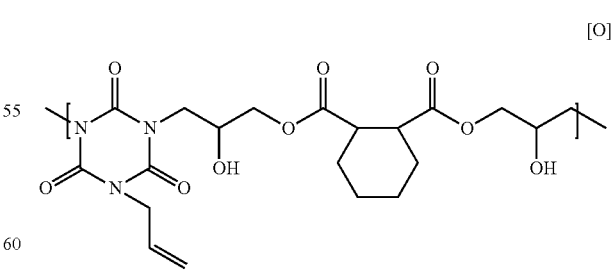

[O]

Synthesis Example 16

15.86 g of 1,2-cyclohexane dicarboxylic acid, 25.00 g of monoallyl diglycidyl isocyanurate, and 3.35 g of ethyl triphenyl phosphonium bromide were dissolved in 54.03 g of cyclohexanone, and then the solution was reacted at 140° C. for 4 hours to obtain a solution containing a polymer. GPC analysis of the obtained polymer showed a weight-average molecular weight of 3,300 in terms of standard polystyrene. The obtained polymer seems to have a structural unit of Formula [P] below, and have a carboxy group on its end. Note that the end of the polymer obtained in this Synthesis Example is different from the end of the polymer obtained in Synthesis Example 15.

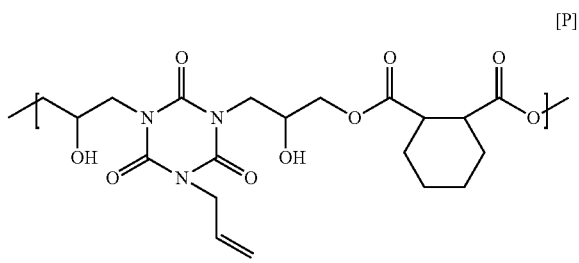

[P]

Synthesis Example 17

25.00 g of 2,2-bis(4-glycidyloxycyclohexane)propane, 9.67 g of monoallyl isocyanurate, and 1.04 g of ethyl triphenyl phosphonium bromide were dissolved in 53.57 g of cyclohexanone, and then the solution was reacted at 140° C. for 4 hours to obtain a solution containing a polymer. GPC analysis of the obtained polymer showed a weight-average molecular weight of 8,200 in terms of standard polystyrene. The obtained polymer seems to have a structural unit of Formula [Q] below, and have a hydrogen atom on its end.

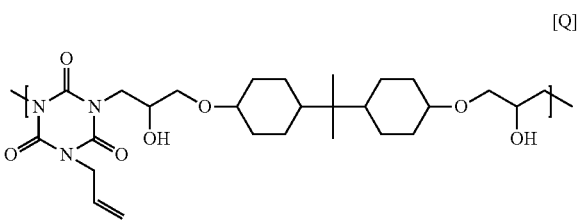

[Q]

Synthesis Example 18

2.0 g of monoallyl diglycidyl isocyanurate and 1.2 g of monoallyl isocyanurate were dissolved in 13.2 g of cyclohexanone, and the solution was heated to 120° C. 0.08 g of benzyl triethyl ammonium chloride was added to the solution, and the mixture was reacted under a nitrogen atmosphere, at 120° C. for 21 hours. After that, the obtained reaction solution was added dropwise into methanol, and then the precipitate was filtered to obtain white powder. GPC analysis of the reaction product showed a weight-average molecular weight of 5,800 in terms of standard polystyrene. The obtained reaction product was a polymer having a structural unit of Formula [R].

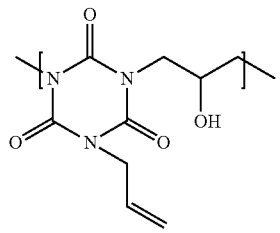

[R]

Example 9

A solution containing the polymer obtained in Synthesis Example 15 was poured into a bottle packed with a cation exchange resin (15JWET, ORGANO CORPORATION) and an anion exchange resin (Monosphere (registered trademark) 550A, Muromachi Technos Co., Ltd.), and agitated for 4 hours. Then the solution was filtered through a polyethylene micro filter having a pore size of 3 μm to prepare an adhesive composition.

Example 10

A solution containing the polymer obtained in Synthesis Example 16 was poured into a bottle packed with a cation exchange resin (15JWET, ORGANO CORPORATION) and an anion exchange resin (Monosphere (registered trademark) 550A, Muromachi Technos Co., Ltd.), and agitated for 4 hours. Then the solution was filtered through a polyethylene micro filter having a pore size of 3 μm to prepare an adhesive composition.

Example 11

A solution containing the polymer obtained in Synthesis Example 17 was poured into a bottle packed with a cation exchange resin (15JWET, ORGANO CORPORATION) and an anion exchange resin (Monosphere (registered trademark) 550A, Muromachi Technos Co., Ltd.), and agitated for 4 hours. Then the solution was filtered through a polyethylene micro filter having a pore size of 3 μm to prepare an adhesive composition.

Example 12

5 g of the polymer powder obtained in Synthesis Example 18 was charged into 45 g of cyclohexanone, and the mixture was agitated for 4 hours. Then the mixture was filtered through a polyethylene micro filter having a pore size of 3 μm to prepare an adhesive composition.

Example 13

A solution containing the polymer obtained in Synthesis Example 15 was poured into a bottle packed with a cation exchange resin (15JWET, ORGANO CORPORATION) and an anion exchange resin (Monosphere (registered trademark) 550A, Muromachi Technos Co., Ltd.), and agitated for 4 hours. Then the solution was filtered through a polyethylene micro filter having a pore size of 3 μm. ORGANOSILICASOL (MEK-AC-2101, manufactured by Nissan Chemical Industries, Ltd.) whose mass was one ninth of the mass of the polymer (solid content) contained in the solution was added to the filtrate, and the mixture was agitated to prepare an adhesive composition.

Example 14

A solution containing the polymer obtained in Synthesis Example 16 was poured into a bottle packed with a cation exchange resin (15JWET, ORGANO CORPORATION) and an anion exchange resin (Monosphere (registered trademark) 550A, Muromachi Technos Co., Ltd.), and agitated for 4 hours. Then the solution was filtered through a polyethylene micro filter having a pore size of 3 μm. ORGANOSILICASOL (MEK-AC-2101, manufactured by Nissan Chemical Industries, Ltd.) whose mass was one ninth of the mass of the polymer (solid content) contained in the solution was added to the filtrate, and the mixture was agitated to prepare an adhesive composition.

Comparative Example 5

10 g of N-methyl-2-pyrrolidone was added to 10 g of a poly(pyromellitic dianhydride-co-4,4'-oxydianiline) amic acid solution (Pyre-ML RC-5019, 16% by mass N-methyl-2-pyrrolidone solution, manufactured by Sigma-Aldrich Japan K.K.) that is a polyimide precursor, to prepare an adhesive composition.

[Measurement of Transmittance]

The adhesive compositions prepared in Examples 9, 10, 11, 13, and 14, and Comparative Example 5 were applied to respective quartz substrate by use of a spin coater. Each of the quartz substrates was baked at 200° C. for 5 minutes on a hot plate to form a film having a thickness of 1 μm. A transmittance of the film at a wavelength of 500 nm was measured by use of an ultraviolet-visible spectrophotometer UV-2550 (manufactured by SHIMADZU Corporation).

Each of the films formed from the adhesive compositions prepared in Examples 9 and 10, and Comparative Example 5 was further baked at 270° C. for 5 minutes, and then its transmittance at a wavelength of 500 nm was measured.

Table 7 below shows the results of the measurement. As shown in Table 7, the results suggest that the films formed from the adhesive compositions prepared in Examples 9 and 10 have higher transmittances compared to the film formed from the adhesive composition prepared in Comparative Example 5, keep high transmittances even after baked at 270° C., and are heat resistant.

TABLE 7

|  | Transmittance (Wavelength 500 nm) | |
| --- | --- | --- |
|  | 200° C. | 270° C. |
| Example 9 | 99% | 97% |
| Example 10 | 99% | 97% |
| Example 11 | 97% | — |
| Example 13 | 99% | — |
| Example 14 | 99% | — |
| Comparative Example 5 | 90% | 88% |

[Test of Elution to Solvent]

The adhesive compositions prepared in Examples 9, 10, 11, 13, and 14, and Comparative Example 5 were applied to respective silicon wafers by use of a spin coater. Each of the silicon wafers was baked at 200° C. for 5 minutes on a hot plate to form a film having a thickness of 1 μm. The film was soaked in N-methyl-2-pyrrolidone at 23° C. for 2 minutes. It was confirmed that in the films formed from the adhesive compositions prepared in Examples 9, 10, 11, 13, and 14, the film thickness was changed by 1% or less before and after soaking. In contrast, the film formed from the adhesive composition prepared in Comparative Example 5 was dissolved after being soaked in N-methyl-2-pyrrolidone and 20% or more of the film thickness before soaking was lost.

[Evaluation of Adhesive Force]

The adhesive compositions prepared in Examples 9, 10, and 11 were applied to respective silicon wafers by use of a spin coater. Each of the silicon wafers was baked at 100° C. for 4 minutes, and 160° C. for 4 minutes to form a film having a thickness of 5 rm. Then the film formed on the silicon wafer was bonded to a glass wafer having a diameter of 4 inches by use of a bonding system (VJ-300, manufactured by Ayumi Industries Company Limited), under a vacuum of 10 Pa or less, a temperature of 160° C., and a bonding pressure of 800 kg. Next, the bonded wafers were cut into 1 square centimeter with a dicing device (DAD321, manufactured by DISCO Corporation) to prepare a sample for evaluating adhesive force.

Araldite (registered trademark) 2014 (manufactured by Huntsman Advanced Materials LLC) was applied to both surfaces of each of the obtained samples for evaluating adhesive force. Then both of the surfaces were bonded to a dedicated jig for adhesive force (shear) measurement, and adhesive force (shear) was tested and evaluated by use of Autograph (Autograph AGS-100NX, manufactured by SHIMADZU Corporation). Adhesive force was measured at a tension speed of 1 mm/minute. Table 8 below shows the results. In Table 8, a value of adhesive force "1000 N or greater" means that the value is equal to or greater than the measurement limit of the adhesive force measuring instrument. Samples obtained with the adhesive compositions prepared in Examples 9, 10, and 11 were confirmed to have sufficient adhesiveness.

TABLE 8

|  | Adhesive Force (Shear) |
| --- | --- |
| Example 9 | 1000 N or greater |
| Example 10 | 1000 N or greater |
| Example 11 | 1000 N or greater |

The invention claimed is:
1. An adhesive composition comprising:
an organic solvent; and
a polymer having a weight-average molecular weight of 1,000 to 100,000, the polymer having a structural unit of one or more of Formula (6-2) and Formula (6-3):

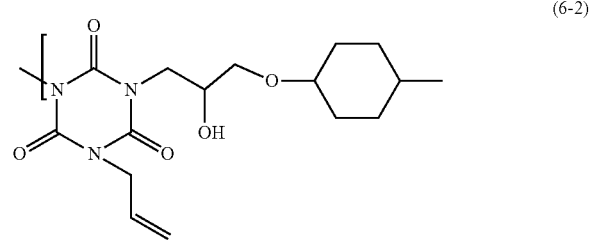

(6-2)

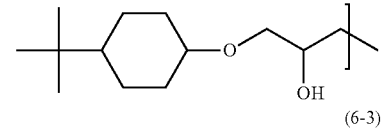

(6-3)

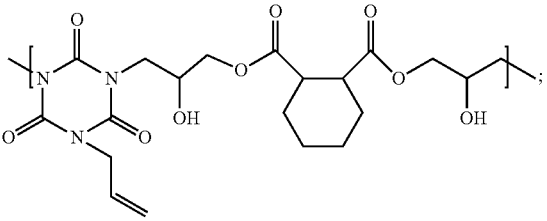

wherein
adhesive composition has a viscosity of 0.001 to 5,000 Pa·s.

2. The adhesive composition according to claim 1, wherein the polymer
is a polymer having a structural unit of Formula (6-2), and includes a structural unit of Formula [Q]:

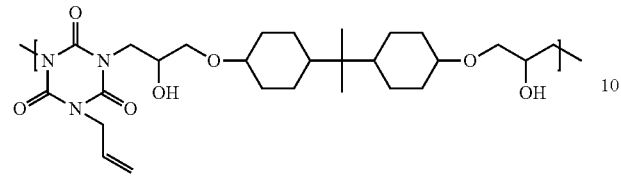
[Q]

that has a hydrogen atom on its end.

3. The adhesive composition according to claim 1, wherein the polymer
is a polymer having a structural unit of Formula (6-3), and includes a structural unit of Formula [O]:

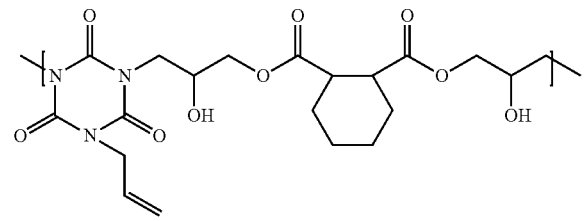
[O]

that has a hydrogen atom on its end.

4. An adhesive composition comprising:
an organic solvent; and
a polymer having a weight-average molecular weight of 1,000 to 100,000, the polymer having a structural unit of Formula [P]:

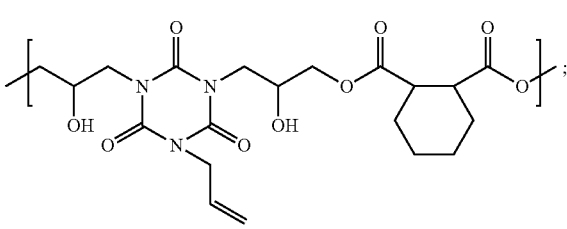
[P]

and
having a carboxy group on its end; wherein
the adhesive composition has a viscosity of 0.001 to 5,000 Pa·s.

5. The adhesive composition according to claim 1, the adhesive composition consisting of the organic solvent and the polymer.

6. The adhesive composition according to claim 4, the adhesive composition consisting of the organic solvent and the polymer.

* * * * *